(12) United States Patent
Sidhwa (10) Patent No.: US 7,927,424 B2
(45) Date of Patent: Apr. 19, 2011

(54) PADDED CLAMP RING WITH EDGE EXCLUSION FOR DEPOSITION OF THICK ALCU/ALSICU/CU METAL ALLOY LAYERS

(75) Inventor: Ardeshir Jehangir Sidhwa, Scottsdale, AZ (US)

(73) Assignee: STMicroelectronics, Inc., Coppell, TX (US)

( * ) Notice: Subject to any disclaimer, the term of this patent is extended or adjusted under 35 U.S.C. 154(b) by 582 days.

(21) Appl. No.: 10/131,455

(22) Filed: Apr. 22, 2002

(65) Prior Publication Data
US 2003/0196604 A1    Oct. 23, 2003

(51) Int. Cl.
*H01L 21/00* (2006.01)
*C23C 16/00* (2006.01)
*C23C 14/00* (2006.01)

(52) U.S. Cl. ... 118/728; 118/725; 118/724; 156/345.51; 156/345.52; 156/345.53

(58) Field of Classification Search .......... 118/715, 118/730, 500, 728, 725, 724; 156/345, 345.51, 156/345.52, 345.53
See application file for complete search history.

(56) References Cited

U.S. PATENT DOCUMENTS 5,810,931 A * 9/1998 Stevens et al. ............... 118/721
6,162,336 A * 12/2000 Lee ........................ 204/298.15

FOREIGN PATENT DOCUMENTS

JP          09143716 A  *  6/1997
JP       2002134413 A  *  5/2002

* cited by examiner

*Primary Examiner* — Ram N. Kackar
(74) *Attorney, Agent, or Firm* — Lisa K. Jorgenson; William A. Munck (57) ABSTRACT

A substrate clamp ring has an edge exclusion lip with a variable bottom surface. At least a portion of that bottom surface has a height above the substrate contact level selected to minimize accumulation over time of deposited aluminum-copper alloy across lower portions of the bottom surface, and to allow the aluminum-copper alloy to be deposited to a thickness of at least 2 microns on each of a predetermined number of substrates without bridging. The height of the bottom surface at an innermost edge of the lip is preferably about 17 mils, while a height of the bottom surface over the substrate edge is preferably about 8.5 mils.

21 Claims, 6 Drawing Sheets

PADDED CLAMP RING WITH EDGE EXCLUSION FOR DEPOSITION OF THICK ALCU/ALSICU/CU METAL ALLOY LAYERS

TECHNICAL FIELD OF THE INVENTION

The present invention is directed, in general, to clamp rings for securing substrates to a support member within a deposition chamber and, more specifically, to clamp rings having edge exclusion lips projecting over a peripheral portion of the secured substrate.

BACKGROUND OF THE INVENTION

As either an alternative or a supplement to vacuum or electrostatic chucks, substrates are often secured to a support platform within a deposition chamber by a clamp ring during sputtering or vapor deposition of material onto the substrate. Generally metallic, clamp rings are typically annular disks received on an upper surface of the substrate within the deposition chamber (e.g., by motion of a retractable support platform raising the substrate into contact with the clamp ring), exerting (together with the support platform) compressive force on the peripheral edge of the substrate to hold the substrate fixed during processing and reduce warping.

Because the clamp ring contacts the substrate surface onto which material is deposited and itself generally has material deposited thereon during deposition, "bridging" of deposited material between the clamp ring and substrate may cause the substrate to stick to the clamp ring. To avoid or minimize such bridging, the clamp ring may only contact the upper surface of the substrate at regularly spaced peripheral locations.

In addition, the clamp ring may include an edge exclusion lip around an inner circumference between and around these contacts or tabs, projecting over the peripheral edge of the substrate to inhibit deposited material from passing through the gap between the clamp ring and the substrate and around the substrate edge (i.e. by forming a tortuous path for passage through that gap). Particularly when the support platform is only nominally larger than the substrate, deposition vapors or materials passing around the edge of the substrate (and support platform) may adhere to surfaces below the support platform and may, for example, form aggregate deposits over time which impede proper operation of a retractable platform.

The design of contact surfaces and edge exclusion lips for clamp rings thus involves trade-offs between minimizing the potential for bridging, limiting passage of deposition material around the substrate and support platform edges, and shadowing no more of the substrate surface than necessary with the edge exclusion lip (as the shadowed regions become unusable). In that regard, the lip width (the distance by which the lip projects over the edge of the substrate, shadowing the underlying portions of the substrate and rendering them unusable) is balanced against lip height (the distance between the lip's bottom surface and the substrate, where closer proximity of the lip to the substrate renders bridging more likely).

U.S. Pat. No. 5,810,931 discloses a clamp ring with an edge exclusion lip having a stepped bottom surface or "roof," where the variable profile of the lip's lower surface allows a greater effective aspect ratio of total lip width to minimum lip height despite a decrease in one or both dimensions. A presently available commercial embodiment of that clamp ring is suitable for deposition of thin aluminum layers. However, when used during deposition of thick (<2 μm) aluminum-copper (AlCu) and other metal alloy layers, including aluminum-silicon-copper (AlSiCU) and copper (Cu), and particularly during hot deposition of such layers, both the life (i.e, the number of lots which may be run before problems such as sticking arise) and the throughput (e.g., the number of lots which may be run before a cool-down period is required) for the clamp ring are substantially reduced.

There is, therefore, a need in the art for an improved clamp ring providing edge exclusion with acceptable life and throughput for aluminum-copper alloy deposition, particularly hot deposition of thick aluminum-copper alloy layers.

SUMMARY OF THE INVENTION

To address the above-discussed deficiencies of the prior art, it is a primary object of the present invention to provide, for use in a deposition chamber, a substrate clamp ring having an edge exclusion lip with a variable bottom surface. At least a portion of that bottom surface has a height above the substrate contact level selected to minimize accumulation over time of deposited aluminum-copper alloy across lower portions of the bottom surface, and to allow the aluminum-copper alloy to be deposited to a thickness of at least 2 microns on each of a predetermined number of substrates without bridging. The height of the bottom surface at an innermost edge of the lip is preferably about 17 mils, while a height of the bottom surface over the substrate edge is preferably about 8.5 mils.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5C, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device. Unless otherwise indicated, the drawings are not to any particular scale, but instead may have selected features exaggerated for clarity in explaining the present invention.

Figure 1:
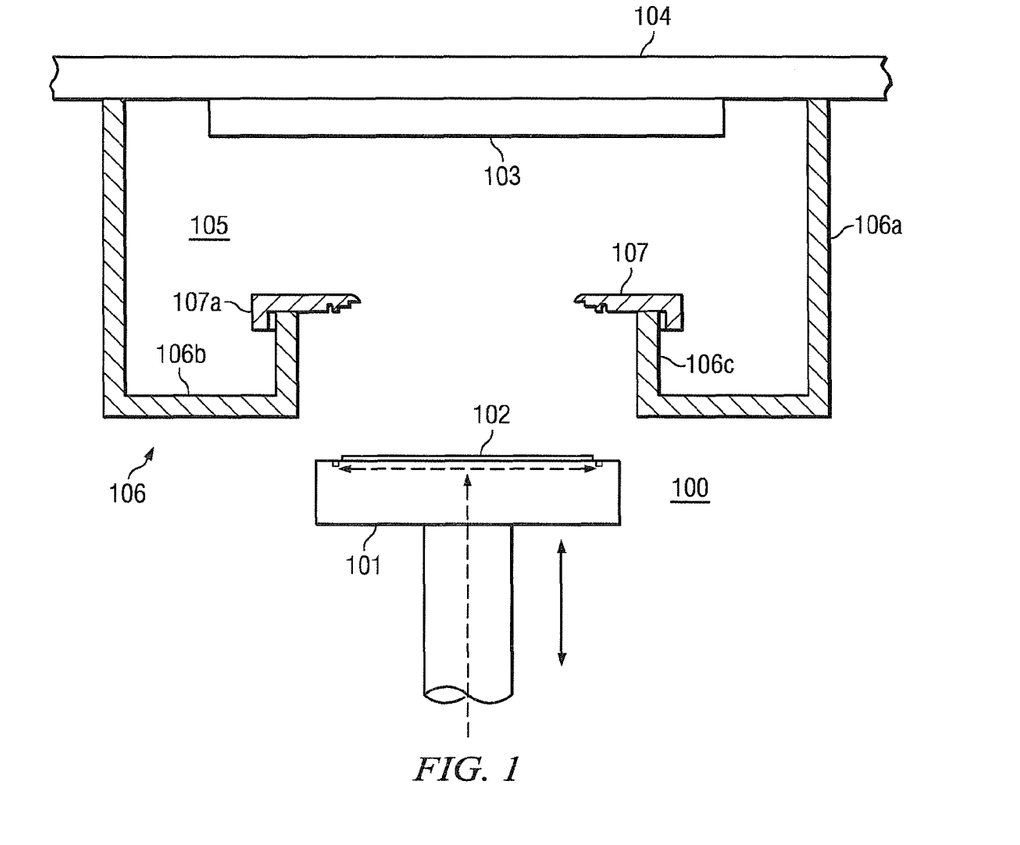
FIG. 1 depicts a simplified cross-sectional view of a portion of a deposition chamber including an improved clamp ring according to one embodiment of the present invention.
Figure 1A:
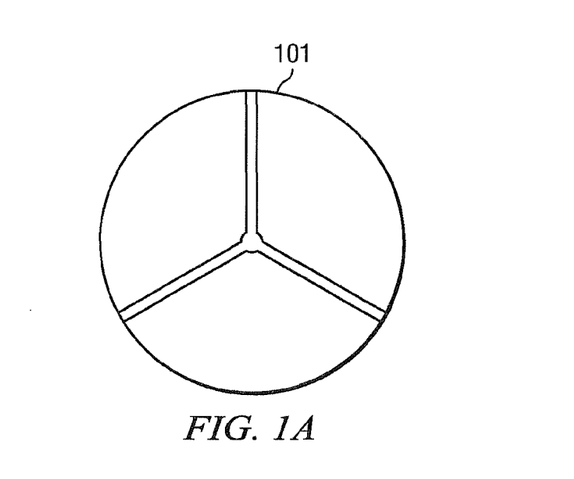

FIG. 1 depicts a simplified cross-sectional view of a portion of a deposition chamber including an improved clamp ring according to one embodiment of the present invention. Deposition chamber 100, which is a vacuum enclosure employed for sputter deposition, chemical vapor deposition (CVD), plasma enhanced chemical vapor deposition (PECVD), and the like, includes a retractable substrate support platform (or "pedestal") 101, which may include a heating element therein for heating the substrate 102 resting on an upper surface thereof. An optional target 103 providing source material for deposition is secured to an upper surface 104 of a processing enclosure 105, which is further defined by a shield 106 having a cylindrically annular vertical outer wall 106a, an annular disk-shaped bottom surface 106b, and a cylindrically annular inner wall 106c forming a passage for support platform 101.

Generally disk-shaped, annular clamp ring 107 is secured over the top of the passage formed by inner shield wall 106c with outer flange 107a encompassing a portion of inner shield wall 106c. In operation, a substrate is loaded into deposition chamber 100 and placed on the upper surface of support platform 101. Support platform 101 is then raised until substrate 102 engages the contact surface(s) of clamp ring 107, with an edge exclusion lip projecting radially inward over the peripheral edge of substrate 102 as described in further detail below. In that position, processing enclosure 105 is effectively enclosed by deposition chamber upper surface 104, shield 106, clamp ring 107, support platform 101 and substrate 102, with the exception of any gap between clamp ring 107 and substrate 102 around the edge of support platform 101.

Figure 2:
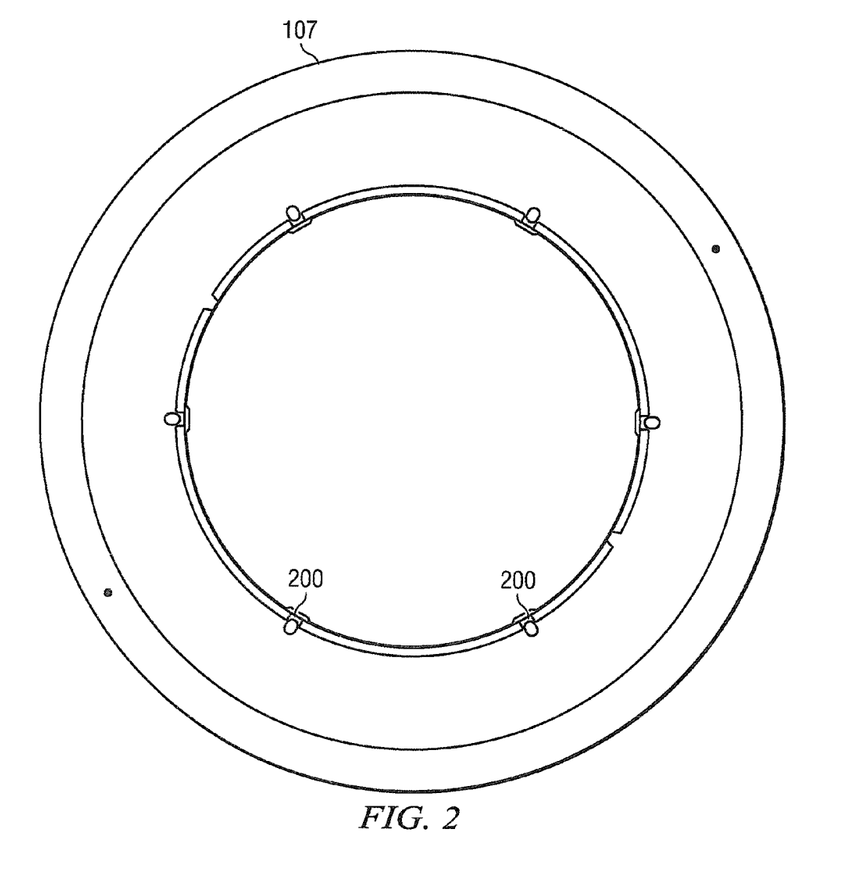
FIG. 2 depicts a simplified bottom view of an improved clamp ring according to one embodiment of the present invention.

FIG. 2 depicts a simplified bottom view of an improved clamp ring according to one embodiment of the present invention. Clamp ring 107 could include a single contact surface in the form of an annular ring projecting from a bottom surface of clamp ring 107 near an inner peripheral rim, in which case an edge exclusion lip projecting from the contact surface inward over the substrate spaced at a distance therefrom includes a stepped bottom surface extending around the entire circumference of the inner peripheral edge of clamp ring 107.

Figure 2A:
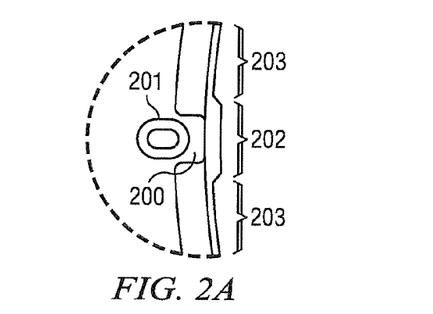
FIG. 2A depicts in greater detail a bottom view of one contact surface and surrounding portions of an improved clamp ring according to one embodiment of the present invention.

In the exemplary embodiment, however, clamp ring includes a discrete number (six in the example shown) of periodically spaced contact surfaces 200 projecting downwardly along the inner peripheral edge, the structure of which is shown in greater detail in FIG. 2A. In the example shown, contact surface 200 projects radially inward from a bottom surface of the clamp ring proximate to a guide hole 201. An edge exclusion lip region 202 around a contact surface 200 extends further inward toward a radial center of the clamp ring 107 than the edge exclusion lip regions 203 extending between adjacent contact surfaces 200, and does not include a variable profile bottom surface like edge exclusion lip regions 203.

Figure 3A:
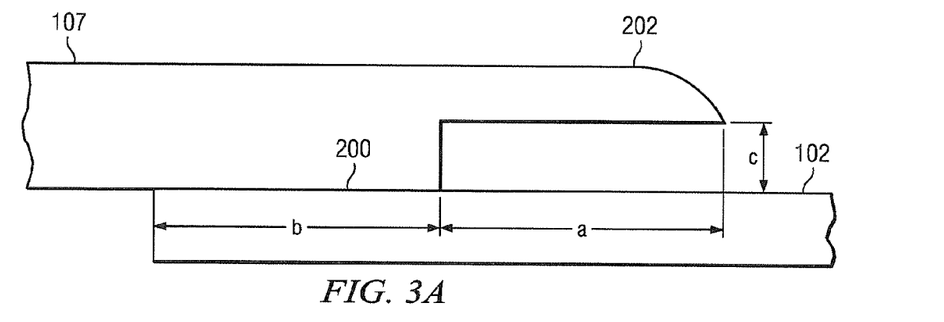
FIGS. 3A-3D depict partial cross-sectional views of a contact surface and an edge exclusion lip on an improved clamp ring in relation to a secured substrate according to various embodiments of the present invention.

FIGS. 3A-3D depict partial cross-sectional views of a contact surface and an edge exclusion lip on an improved clamp ring in relation to a secured substrate according to various embodiments of the present invention. FIG. 3A depicts a cross-sectional view of contact surface 200 and edge exclusion lip region 202 for a portion of clamp ring 107 taken at section line 3A in FIG. 2A. Contact surface 200 engages an upper peripheral surface of substrate 102, with edge exclusion lip 202 projecting inwardly over the substrate 102, spaced apart therefrom by a distance c, for a distance a+b from an edge of the substrate.

The bottom surface of edge exclusion lip 202 is not variable in the exemplary embodiment, but could be variable in an alternative embodiment. For simplicity, a single-level edge exclusion lip 202 around contact surface 200 may project further inward, and be spaced further from the surface of substrate 102, without inordinate waste of substrate surface area.

Figure 3B:
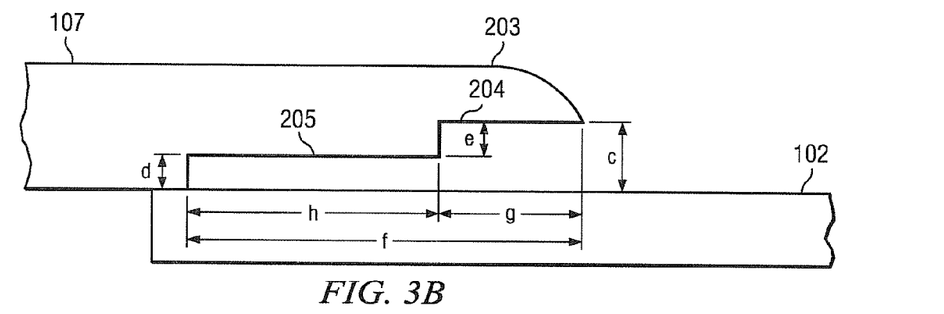

FIG. 3B depicts a cross-sectional view of edge exclusion lip region 203 for a portion of clamp ring 107 taken at section line 3B in FIG. 2A. As used herein, the height of any portion of the bottom surface (or "roof") of the edge exclusion lips 202-203 is the distance of the surface from the plane containing the contact surface 200 (and therefore the distance from a substrate secured by the clamp ring).

Edge exclusion lip 203 projects inwardly over the substrate 102, spaced apart therefrom, for a total distance f<a+b from an edge of the substrate. The bottom surface of edge exclusion lip 203 is variable, spaced a height c above the substrate surface near an innermost periphery of edge exclusion lip 203 and spaced a height d<c above the substrate surface at the substrate edge, to provide a greater effective aspect ratio. In particular, the bottom surface of edge exclusion lip 203 is stepped in the embodiment of FIG. 3B, providing upper and lower roofs 204 and 205 both substantially parallel to the substrate surface and separated by a step height $e=c-d$, with lower roof 205 spaced from the level of contact surface 200 by the step height d. The width g of upper roof 204 and the width h by which lower roof 205 extends over the substrate 102 from an edge thereof (where lower roof 205 has a total width $i=j+h$ and the total width f by which edge exclusion lip overhangs substrate 107 equals g+h) may be equal or unequal, and collectively provide an total effective aspect ratio of f/d.

FIGS. 4A-4C and 5A-5C depict various configurations of a variable bottom surface edge exclusion lip and corresponding simulations of deposition material accumulation thereon according to various embodiments of the present invention. The configurations illustrated correspond to the embodiment of variable bottom surface edge exclusion lip region 203 depicted in FIG. 3B, but with various step sizes. In all three embodiments, the total step width h of the upper roof is 82 mils (0.082 inches) while the total step width j of the lower roof is 270 mils.

Figure 4A:
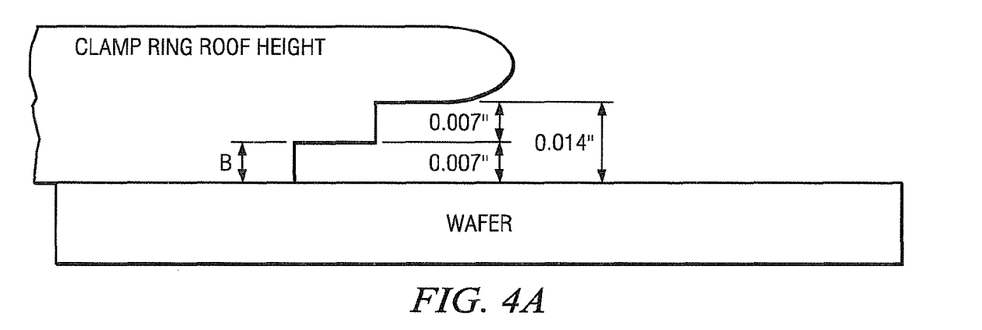
FIGS. 4A-4C and 5A-5C depict various configurations of a variable bottom surface edge exclusion lip and corresponding simulations of deposition material accumulation thereon according to various embodiments of the present invention.
Figure 5A:
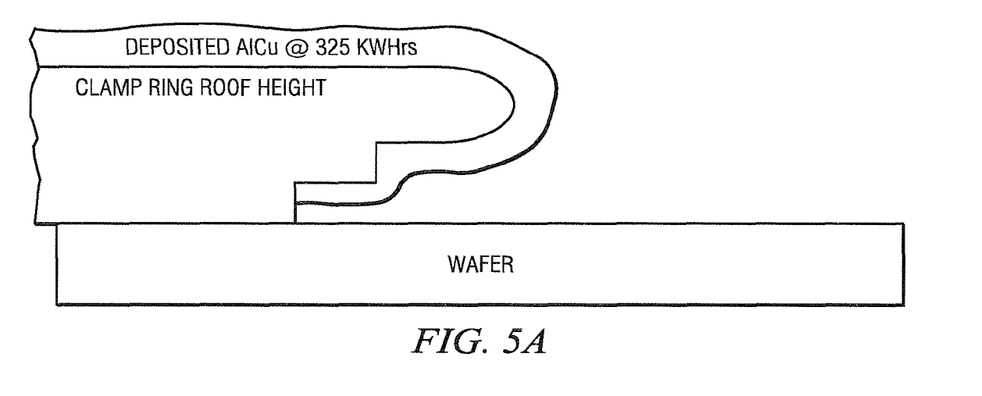

For FIGS. 4A and 5A, which correspond to the presently available commercial clamp ring having a stepped bottom surface edge exclusion lip as described above, the total distance c of the upper roof from the substrate surface is 14 mils, with the step height e of the upper roof being 7 mils and the step height d of the lower roof also being 7 mils.

After aluminum-copper alloy is deposited to a thickness greater than 2 micron (μm) on each substrate within a predetermined number of lots, corresponding to a total deposition time of 325 kilo-Watt hours (KWHrs), the accumulated deposition material on the edge exclusion lip extends across the upper roof, the sidewall between the upper and lower roofs, and the lower roof to the sidewall between the lower roof and the substrate contact level. It is believed that thick aluminum-copper alloy deposition causes aluminum on the clamp ring to stick on the wafer after a hot, thick aluminum-copper deposition step.

Figure 4B:
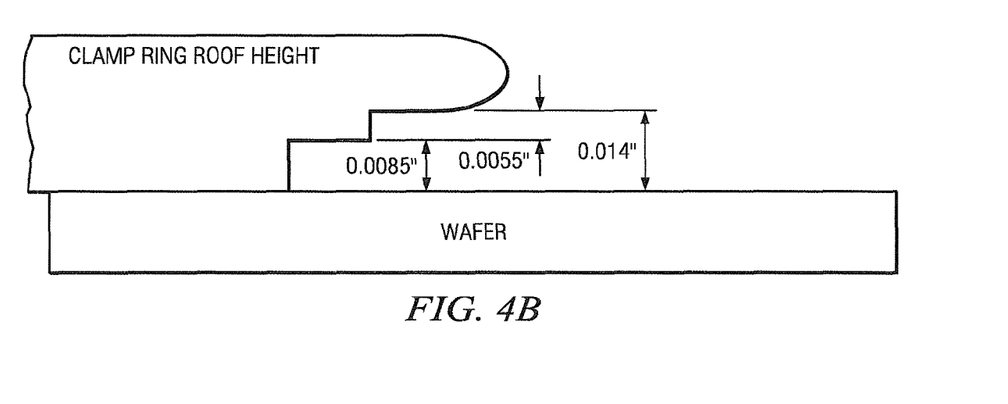
Figure 5B:
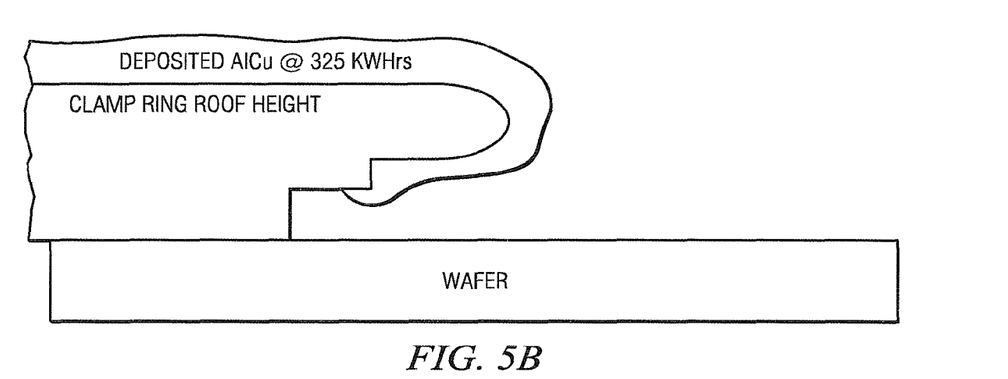

For FIGS. 4B and 5B, the total distance c of the upper roof from the substrate surface remains 14 mils; however, the step height d of the lower roof is increased to approximately 8.5 mils while the step height e of the upper roof is decreased to about 5.5 mils. The accumulation of deposition material on the edge exclusion lip following 325 KWHrs extends across the upper roof and the sidewall between the upper and lower roofs, and partially across the lower roof.

Figure 4C:
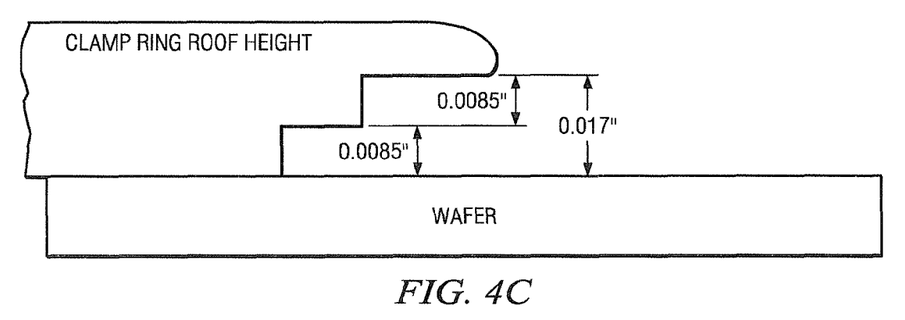
Figure 5C:
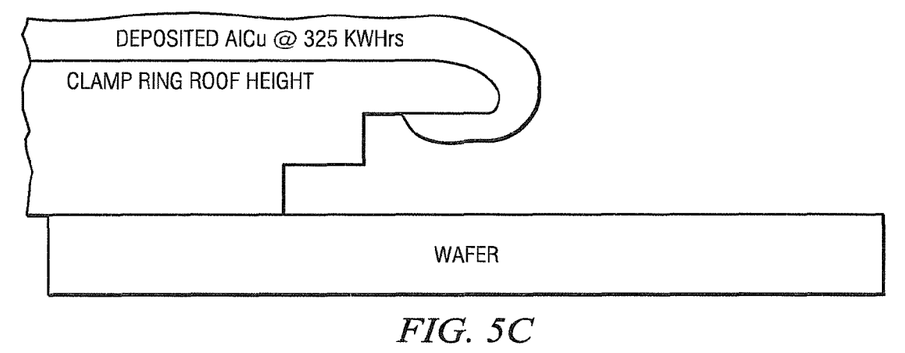

Finally, for FIGS. 4C and 5C, the preferred embodiment for thick AlCu deposition over 200 KWHrs, the total distance c of the upper roof from the substrate surface is increased to about 17 mils, with the step heights d and e of the lower and upper roofs, respectively, both equal to approximately 8.5 mils. After 325 KWHrs, the accumulation of deposition material on the edge exclusion lip extends only partially across the upper roof, without reaching the sidewall between the upper and lower roofs. Accumulated material is thus kept a sufficient distance away from the substrate surface to avoid bridging and sticking, while shadowing of the wafer edge remains sufficient to limit the amount of material passing around the substrate and support platform edges.

By selecting the roof height(s) for a stepped bottom edge exclusion lip based on the material selected to be deposited, the thickness to which the selected material is to be deposited on each substrate, and the number of substrates on which the selected material is to be deposited to the predefined thickness, an appropriate amount of space between the substrate and the clamp ring's edge exclusion lip is provided. For thick AlCu metal deposition, the modification to the clamp ring should provide longer padded clamp ring life (400 KWHrs or more), with cost and downtime savings for fewer clamp ring replacements, and avoids the considerable expense of converting to an electrostatic chuck. The new clamp ring design also provides longer deposition chamber life, and therefore increased production through that chamber. Moreover, production speed increases since 50 lots can be run without a cool-down period, rather than merely 2 lots.

Figure 3C:
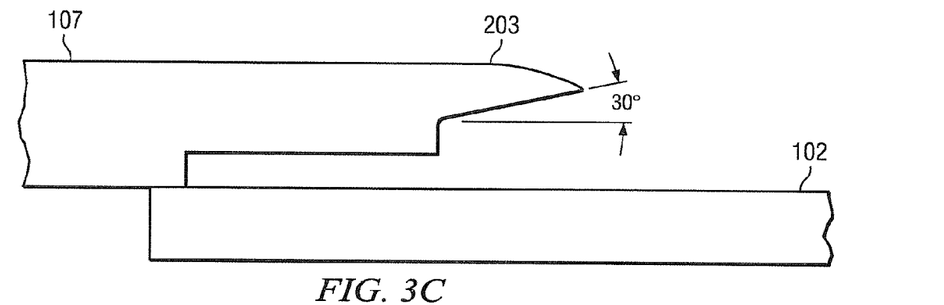
Figure 3D:
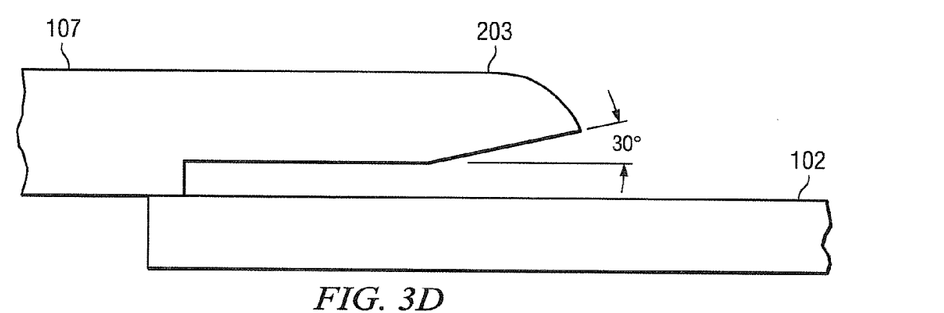

FIG. 3C depicts a cross-sectional view of edge exclusion lip region corresponding to a portion of clamp ring 107 in accordance with an alternative embodiment of the present invention, taken at a point corresponding to section line 3B in FIG. 2A. In this embodiment, the step width h of the upper roof equals the distance i which lower roof projects over substrate 107 from the substrate edge. The bottom surface of the edge exclusion lip is variable, spaced a distance c apart from the substrate surface near an innermost periphery of edge exclusion lip 203 and spaced a distance d<c apart from the substrate surface at the substrate edge. Rather than being stepped, however, the upper roof is sloped continuously across the step width.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A clamp ring for securing a substrate comprising:
a body, the body including one or more substrate contacting surfaces projecting from the body each contacting the substrate at a peripheral edge of the substrate when the clamp ring is securing the substrate; and
an edge exclusion lip projecting from the body inwardly from the substrate contacting surfaces, the edge exclusion lip having
a first bottom surface extending a first width from the body toward a terminal edge of the edge exclusion lip furthest from the body and a first height from a plane including the substrate contacting surfaces, and
a second bottom surface extending a second width from the terminal edge toward the body and a first height plus a second height from the plane including the substrate contacting surfaces,
wherein, when the clamp ring is securing the substrate, the first bottom surface is substantially constantly spaced from the substrate across the first width and the second bottom surface is variably spaced from the substrate across the second width, and wherein a surface joining the first bottom surface and the second bottom surface is perpendicular to the first bottom surface.

2. A deposition chamber including the clamp ring according to claim 1, the deposition chamber comprising:
a vacuum enclosure;
a shield member within the enclosure and including a portion defining a passage therethrough and providing support for the clamp ring; and
a retractable substrate support platform selectively movable through the passage through the shield member to bring a substrate positioned on a surface of the support platform into contact with the one or more substrate contacting surfaces.

3. The clamp ring according to claim 1, where an edge of the second bottom surface closest to the body is spaced apart from an edge of the first bottom surface furthest from the body.

4. The clamp ring according to claim 1, wherein the second height is equal to the first height.

5. The clamp ring according to claim 4, wherein the first and second heights are each about 0.007 inches.

6. The clamp ring according to claim 4, wherein the first and second heights are each about 0.0085 inches.

7. The clamp ring according to claim 1, wherein the second height is less than the first height.

8. The clamp ring according to claim 7, wherein the first height is about 0.0085 inches and the second height is about 0.0055 inches.

9. The clamp ring according to claim 1, wherein the substrate contacting surfaces comprise six equally spaced contacting surfaces.

10. The clamp ring according to claim 1, wherein the second bottom surface is angled relative to the plane.

11. The clamp ring according to claim 10, wherein the second bottom surface is angled at 30°.

12. The clamp ring according to claim 1, wherein the first width is 0.270 inches.

13. The clamp ring according to claim 1, wherein the second width is 0.082 inches.

14. A clamp ring for securing a substrate comprising:
   a body, the body including one or more substrate contacting surfaces projecting from the body each contacting the substrate at a peripheral edge of the substrate when the clamp ring is securing the substrate; and
   an edge exclusion lip projecting from the body inwardly from the substrate contacting surfaces, the edge exclusion lip having
      a first bottom surface extending a first width from the body toward a terminal edge of the edge exclusion lip furthest from the body, and
      a second bottom surface extending a second width from the terminal edge toward the body,
   wherein, when the clamp ring is securing the substrate, the first bottom surface is substantially constantly spaced from the substrate across the first width and the second bottom surface is angled across the second width relative to a plane including the substrate contacting surfaces, and wherein a surface joining the first bottom surface and the second bottom surface is perpendicular to the first bottom surface.

15. The clamp ring according to claim 14, where an edge of the second bottom surface closest to the body is spaced apart from an edge of the first bottom surface furthest from the body.

16. The clamp ring according to claim 14, wherein the second height is equal to the first height.

17. The clamp ring according to claim 16, wherein the first and second heights are each about 0.007 inches.

18. The clamp ring according to claim 17, wherein the first and second heights are each about 0.0085 inches.

19. The clamp ring according to claim 14, wherein the second height is less than the first height.

20. The clamp ring according to claim 19, wherein the first height is about 0.0085 inches and the second height is about 0.0055 inches.

21. The clamp ring according to claim 14, wherein the substrate contacting surfaces comprise six equally spaced contacting surfaces.

* * * * *